(12) United States Patent
Trivedi et al.

(10) Patent No.: US 6,646,473 B1
(45) Date of Patent: Nov. 11, 2003

(54) MULTIPLE SUPPLY VOLTAGE DYNAMIC LOGIC

(75) Inventors: Pradeep Trivedi, Sunnyvale, CA (US); Sudhakar Bobba, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/170,845

(22) Filed: Jun. 13, 2002

(51) Int. Cl.[7] ............................................ H03K 19/096
(52) U.S. Cl. ............................ 326/96; 326/95; 326/98
(58) Field of Search ............................. 326/93, 95, 98, 326/96; 327/108–112

(56) References Cited

U.S. PATENT DOCUMENTS 6,049,230 A * 4/2000 Durham et al. ............... 326/98
6,346,831 B1 * 2/2002 Krishnamurthy et al. ..... 326/98
6,433,587 B1 * 8/2002 Assaderaghi et al. ......... 326/95

* cited by examiner

*Primary Examiner*—Michael Tokar
*Assistant Examiner*—Vibol Tan
(74) *Attorney, Agent, or Firm*—Rosenthal & Osha L.L.P.

(57) ABSTRACT

A dynamic circuit capable of operating in a normal power consumption mode and at least one reduced power consumption mode is provided. The dynamic circuit is operatively connected to a normal supply voltage and a reduced supply voltage, and is capable of operating at either the normal supply voltage and a normal frequency or at the reduced supply voltage and a reduced frequency. By using such a dynamic circuit, power consumption may be selectively controlled in order to reduce unnecessary power consumption.

17 Claims, 4 Drawing Sheets

MULTIPLE SUPPLY VOLTAGE DYNAMIC LOGIC

BACKGROUND OF INVENTION

As shown in FIG. 1, a typical computer system 10 includes at least a microprocessor 12 and some form of memory 14. The microprocessor 12 has, among other components, arithmetic, logic, and control circuitry that interpret and execute instructions necessary for the operation and use of the computer system 10. Specifically, FIG. 1 shows the computer system 10 having the microprocessor 12, memory 14, integrated circuits (ICs) 16 that have various functionalities, and communication paths 18, i.e., buses and wires, that are necessary for the transfer of data among the aforementioned components of the computer system 10.

One ever-increasingly important factor that is considered in assessing the performance and operation of an integrated circuit relates to power consumption/dissipation. Power is a quadratic function of supply voltage and a linear function of the frequency at which a circuit is operated (i.e., $P = 0.5\, CV^2 f$, where P represents power, C represent total capacitance, V represents supply voltage, and $f$ represents operating frequency), and thus, as integrated circuits continue to operating at ever-increasing frequencies, power consumption/dissipation becomes an important and significant concern for most circuit designers.

Integrated circuit computational blocks, such as arithmetic logic units (ALUs), are often some of the most power-consuming blocks on an integrated circuit. This is because such computational blocks are typically built using dynamic circuits in order to achieve the highest possible performance. As will be evident from the discussion below with reference to FIG. 2, because a dynamic circuit is heavily dependent on clock signal transitions, or other signals to which the dynamic circuit is synchronized, the dynamic circuit consumes significantly more power than those circuits that are not constantly switching between states.

FIG. 2 shows a typical dynamic circuit 45. The operation of a typical dynamic circuit is broken into a precharge phase and an evaluation phase. In the precharge phase, the dynamic circuit is readied for the evaluation stage by some signal to which the dynamic circuit is synchronized, e.g., a clock signal. Then, in the evaluation stage, the dynamic circuit generates an output dependent on its input(s). Typical dynamic circuits are commonly used to perform logic operations such as AND, NAND, OR, and NOR logic.

As will be evident, the particular dynamic circuit 45 shown in FIG. 2 enters a precharge phase when a clock signal, clk 50, goes low and enters an evaluation stage when the clock signal 50 goes high. In FIG. 2, the clock signal 50 serves as an input to a precharge transistor 52. When the clock signal 50 is 'low,' the precharge transistor 52 switches 'on' to precharge a dynamic node, dyn_node 54, to Vdd 55 (i.e., 'high'). When the dynamic node 54 is 'high,' a first output driver transistor 60 switches 'on' and drives a 'low' on an output, out 62, of the dynamic circuit 45 by connecting the output 62 to ground 57. Thus, during the precharge phase, the output 62 is low.

When the clock signal 50 goes high, i.e., enters the evaluation stage, one of two things may happen. Depending on to what value an evaluation block 56 evaluates, the dynamic node 54 is either pulled 'low' or left 'high.' For example, if the evaluation block 56 represents an OR function and is composed of n-type devices, and if one of the inputs to the evaluation block 56 is high, one of the n-type devices switches 'on' causing the dynamic node 54 to be driven 'low' by a connection to ground 57. In this case, the 'low' on the dynamic node 54 switches a second output driver transistor 58 'on,' which, in turn drives a 'high' on the output 62 by a connection to Vdd 55.

Alternatively, if none of the inputs to the evaluation block 56 are high, then the dynamic node 54 does not get connected to ground 57, in which case, the first output driver transistor 60 continues to drive a 'low' on the output 62 by a connection to ground 57. Thus, when the dynamic circuit 45 is in a precharge phase, the dynamic node 54 is readied for the evaluation stage and the output 62 is driven 'low.' When in the evaluation stage, the value of the output 62 depends on to what value the evaluation block 56 evaluates at the start of the evaluation phase.

Those skilled in the art will understand that similar dynamic circuitry and logic may be implemented using various evaluation block functions and structures. For example, an evaluation block for a dynamic circuit may represent an AND function and be composed of p-type devices.

As mentioned above, although dynamic circuits are highly useful and commonly used, they consume relatively high amounts of power due to their switching nature. Consequently, the proper and efficient use of dynamic circuits is of critical importance in circuit design.

SUMMARY OF INVENTION

According to one aspect of the present invention, an integrated circuit having a normal supply voltage and a reduced supply voltage comprises a clock signal selector adapted to output a first clock signal and a second clock signal dependent on a select input to the clock signal selector, and a dynamic circuit comprising: a dynamic node that, in a precharge phase, is connected to one of the normal supply voltage and the reduced supply voltage dependent on the first clock signal and the second clock signal, and an output stage, responsive to the dynamic node, having a first driver device and a second driver device, where, in an evaluation phase, one of the first driver device is selectively used to drive the normal supply voltage onto an output of the dynamic circuit and the second driver device is selectively used to drive the reduced supply voltage onto the output.

According to another aspect, an integrated circuit having a normal supply voltage and a reduced supply voltage comprises a clock signal selector adapted to output a first clock signal and a second clock signal dependent on a select input to the clock signal selector; and a dynamic circuit comprising: an input stage having an evaluation block and a dynamic node, where, in a precharge phase, the dynamic node is operatively connected to one of the normal supply voltage and the reduced supply voltage dependent on the first clock signal and the second clock signal, and where, in an evaluation phase, the dynamic node is selectively connected to ground dependent on at least one input to the evaluation block; and an output driver stage responsive to the dynamic node, where the output driver stage selectively drives one of the normal supply voltage and the reduced supply voltage onto an output of the dynamic circuit dependent on the select input.

According to another aspect, an integrated circuit having a normal supply voltage and a reduced supply voltage comprises: clock selecting means for providing a first clock signal having a first frequency and second clock signal having a second frequency, where the first frequency is greater than the second frequency; precharge means for driving a dynamic node, in a precharge phase, to one of the normal supply voltage and the reduced supply voltage dependent on the first clock signal and the second clock signal; evaluation means for evaluating at least one data input, where the dynamic node is, in an evaluation phase, dependent on the evaluation means; and output means for selectively driving one of the normal supply voltage and the reduced supply voltage onto an output dependent on the dynamic node and a select input to the clock selecting means.

According to another aspect, a method for performing dynamic circuit operations using a normal supply voltage and a reduced supply voltage comprises: selectively outputting a first clock signal having a first frequency and a second clock signal having a second frequency, where the first frequency is greater than the second frequency; in a precharge phase, precharging a dynamic node to one of the normal supply voltage and the reduced supply voltage dependent on the first clock signal and the second clock signal; in an evaluation phase, allowing the dynamic node to be driven by an evaluation block dependent on at least one input to the evaluation block; and selectively driving onto an output one of the normal supply voltage and the reduced supply voltage dependent on the dynamic node and a select signal used for the selectively outputting.

Other aspects and advantages of the invention will be apparent from the following description and the appended claims.

DETAILED DESCRIPTION

Embodiments of the present invention relate to a dynamic circuit that is capable of operating in a normal power consumption mode and at least one reduced power consumption mode. Embodiments of the present invention further relate to a dynamic circuit that may operate at two or more supply voltages and/or at two or more operating frequencies.

Figure 1:
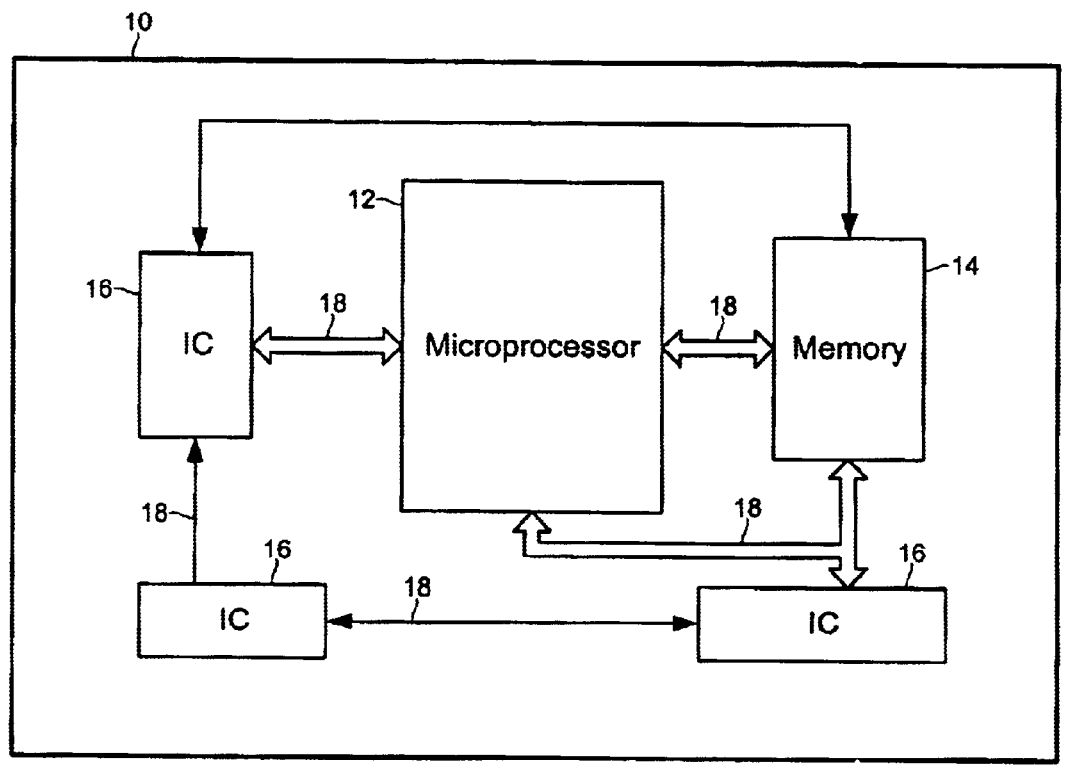
FIG. 1 shows a typical computer system.
Figure 2:
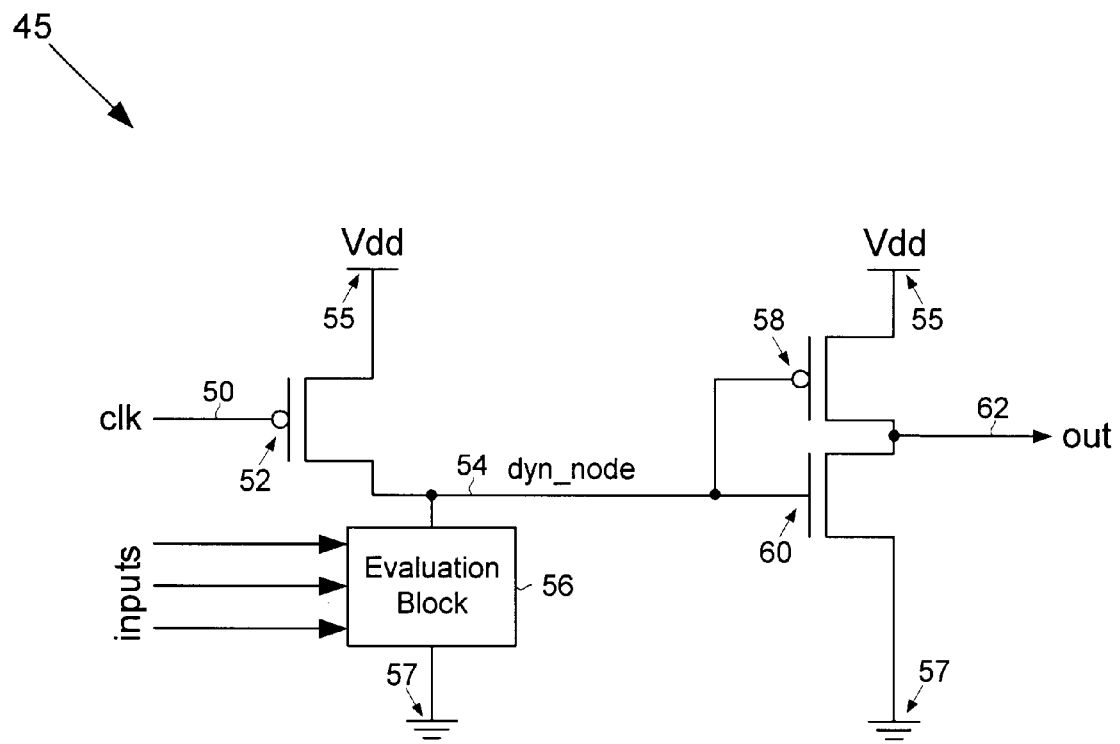
FIG. 2 shows a typical dynamic circuit.
Figure 3:
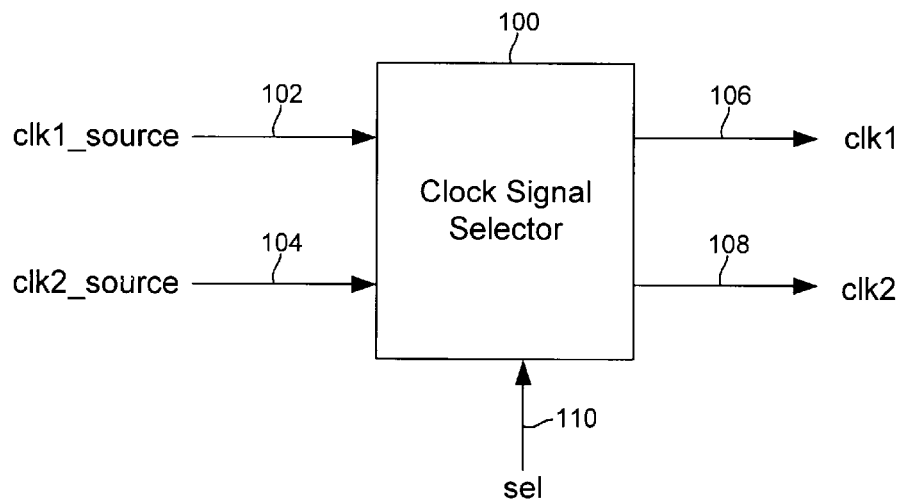
FIG. 3 shows a clock signal selector in accordance with an embodiment of the present invention.

The present invention uses a clock signal selector that provides a dynamic circuit with clock signals having different frequencies. Because power consumption is a function of frequency, by using a clock signal having a lower frequency than another clock signal, power consumption is decreased. FIG. 3 shows a clock signal selector 100 in accordance with an embodiment of the present invention. A first clock signal source, clk1_source 102, and a second clock signal source, clk2_source 104, serve as inputs to the clock signal selector 100. A select input, sel 110, to the clock signal selector 100 is used to determine the behavior of a first clock signal, clk1 106, and a second clock signal, clk2 108.

The frequencies of the first clock signal source 102 and the second clock signal source 104 are different so as to allow the dynamic circuit to have more than one operating frequency for operation (discussed below with reference to FIG. 4). For example, the first clock signal source 102 may be the normal clock signal having a nominal frequency, and the second clock signal source 104 may have a lower-than-nominal frequency. In other embodiments, additional clock signal sources may be used to increase operating flexibility for one or more dynamic circuits.

Still referring to FIG. 3, when the select input 110 is 'low,' the first clock signal 106 equals the first clock signal source 102 (not including the delay of the clock signal selector 100) and the second clock signal 108 is held 'high.' Alternatively, when the select input 110 is 'high,' the first clock signal 106 is held 'high' and the second clock signal 108 equals the second clock signal source 104 (not including the delay of the clock signal selector 100).

Figure 4:
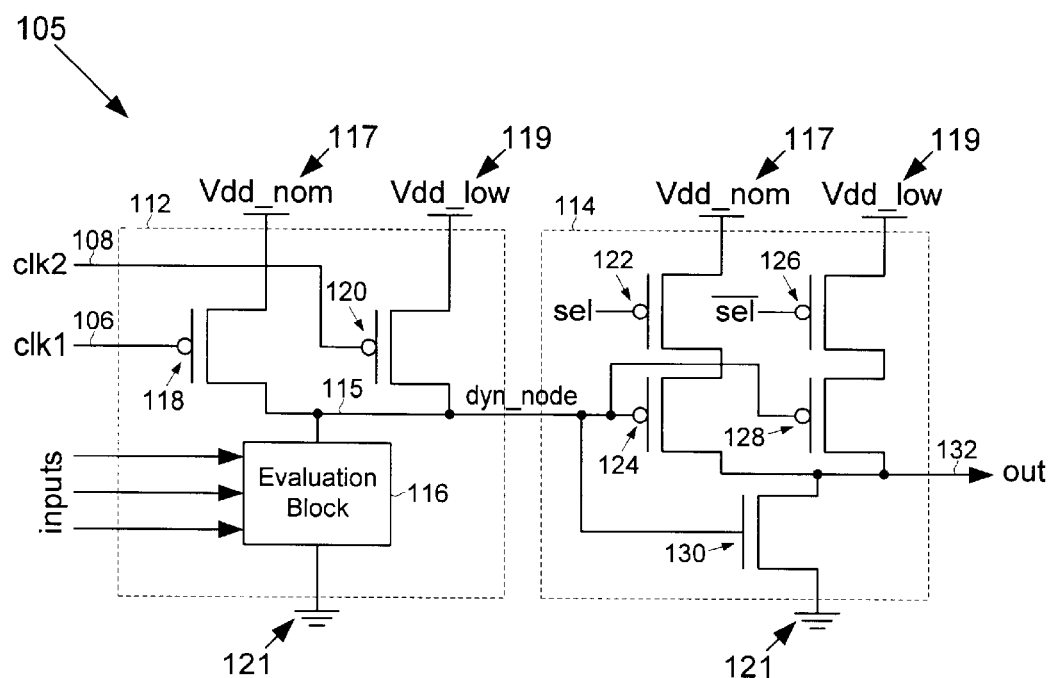
FIG. 4 shows a dynamic circuit in accordance with an embodiment of the present invention.

As mentioned above the clock signal outputs from the clock signal selector 100 are provided to a dynamic circuit such as the exemplary one shown in FIG. 4. In FIG. 4, the dynamic circuit 105 is represented as having a precharge/evaluation stage (or "input" stage) 112 and an output driver stage 114. In the precharge/evaluation stage 112, the first clock signal 106 serves as an input to a first precharge transistor 118, and the second clock signal 108 serves as an input to a second precharge transistor 120. The first precharge transistor 118 is connected to a normal supply voltage, Vdd_nom 117, and the second precharge transistor 120 is connected to a reduced supply voltage, Vdd_low 119.

When the first clock signal 106 is 'low,' the second clock signal 108 does not switch and is held 'high' (discussed above with reference to FIG. 3), and accordingly, the first precharge transistor 118 switches 'on' (the second precharge transistor 120 is 'off'), which, in turn, causes a dynamic node, dyn_node 115, to be driven to Vdd_nom 117. Thus, when the first clock signal 106 goes 'low,' the dynamic circuit 105 enters a precharge phase. Moreover, because, in this case, the dynamic node 115 goes to Vdd_nom 117, a first driver transistor 130 in the output driver 114 switches 'on' and causes an output, out 132, of the dynamic circuit 105 to go 'low' by a connection to ground 121.

When the second clock signal 108 is 'low,' the first clock signal 106 does not switch and is held 'high' (discussed above with reference to FIG. 3), and accordingly, the second precharge transistor 120 switches 'on' (the first precharge transistor 118 is 'off'), which, in turn, causes the dynamic node 115 to be driven to Vdd_low 119. Thus, when the second clock signal 108 goes 'low,' the dynamic circuit 105 enters a precharge phase. Moreover, because, in this case, the dynamic node 115 goes to Vdd_low 119, the first driver transistor 130 in the output driver 114 switches 'on' and causes the output 132 to go 'low' by a connection to ground 121. Those skilled in the art will understand that the size of the first driver transistor 130 may be chosen so that its threshold voltage bears some particular relationship to Vdd_nom 117 and Vdd_low 119.

The dynamic circuit 105 enters an evaluation phase when neither the first precharge transistor 118 nor the second precharge transistor 120 is 'on,' i.e., when both the first clock signal 106 and the second clock signal 108 are 'high.' Consequently, upon entry of the evaluation phase, the dynamic node 115 is not directly connected to either Vdd_nom 117 or Vdd_low 119. In the evaluation phase, if an evaluation block 116 evaluates such that a connection between ground 121 and the dynamic node 115 is provided, the dynamic node 115 goes 'low,' which, in turn, causes a second driver transistor 124 and a third driver transistor 128 to switch 'on.' In this case, if the select input 110 (FIG. 3) is 'low,' a fourth driver transistor 122 drives Vdd_nom 117 to the output 132 via the 'on' second driver transistor 124. Alternatively, if the select input 110 is 'high,' a fifth driver transistor 126 drives Vdd_low 119 to output 132 via the 'on' third driver transistor 128.

In the evaluation phase, if the evaluation block 116 evaluates such that a connection between ground 121 and the dynamic node 115 is not provided, the dynamic node 115 floats 'high' (due to the precharge phase), which, in turn, causes the first driver transistor 130 to remain 'on.' Because the first driver transistor 130 remains 'on,' the output 132 remains 'low' due to its connection to ground 121 via the 'on' first driver transistor 130.

Thus, as can be seen with reference to FIGS. 3 and 4, the dynamic circuit 105 may operate in a normal power consumption mode in which a normal supply voltage, Vdd_nom 117, and a normal operating frequency, clk1 106, are used, or the dynamic circuit 105 may operate in a reduced power consumption mode in which a reduced supply voltage, Vdd_low 119, and a reduced operating frequency, clk2 108, are used.

Those skilled in the art will understand that embodiments of the present invention are not limited to dynamic circuits using only two supply voltages and/or operating frequencies. For example, an embodiment of a dynamic circuit in accordance with the present invention may be constructed to be able to operate among four supply voltages and three operating frequencies. Based on the description with reference to FIGS. 3 and 4, it will be evident to those skilled in the art how to design/construct dynamic circuits that use more than two supply voltages and/or operating frequencies.

Figure 5:
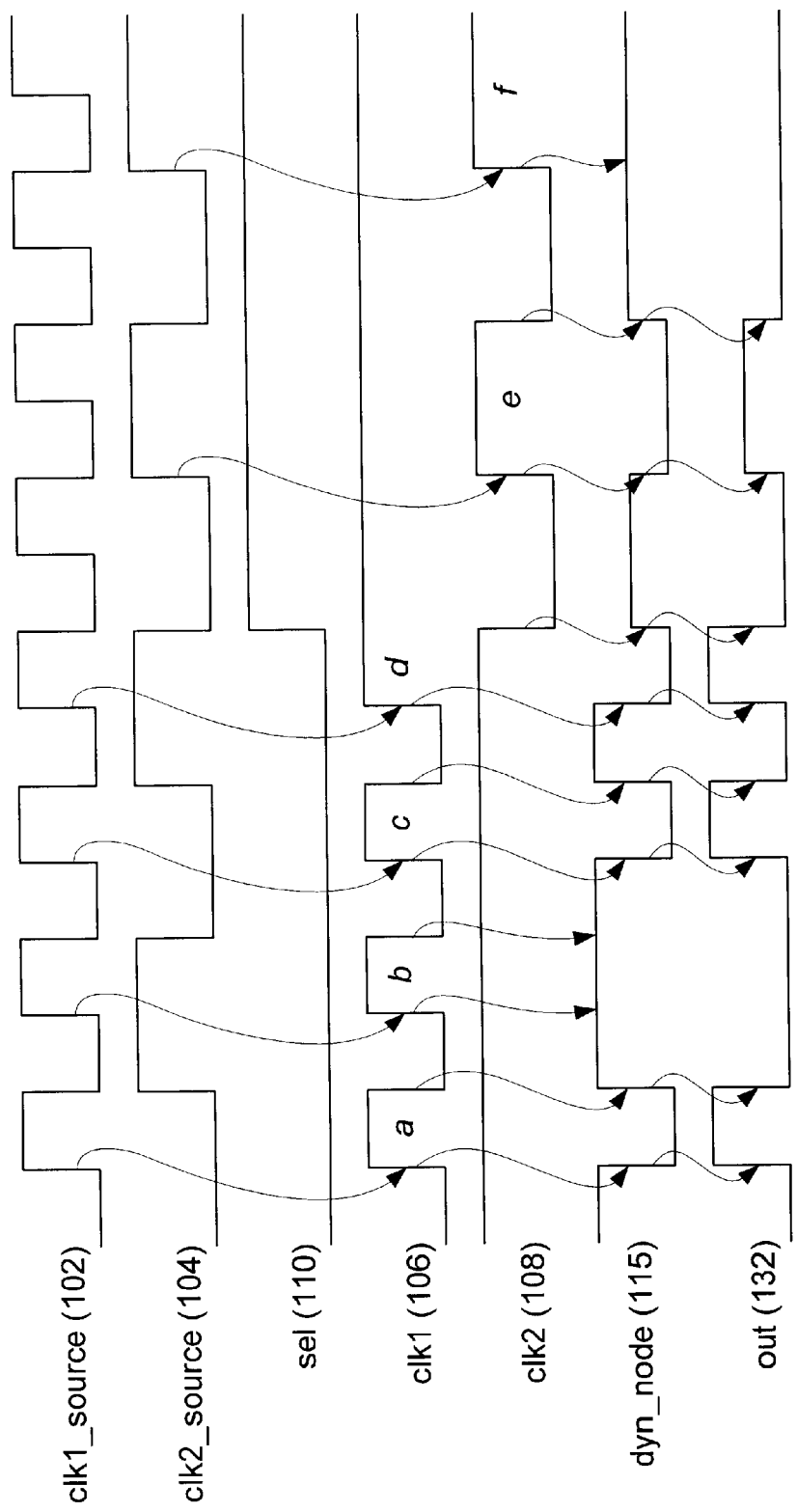
FIG. 5 shows a timing diagram in accordance with clock signal selector shown in FIG. 3 and the dynamic circuit shown in FIG. 4.

FIG. 5 shows an exemplary timing diagram in accordance with the clock signal selector 100 shown in FIG. 3 and the dynamic circuit 105 shown in FIG. 4. For purposes of illustration, delays resulting from signal propagation and transistor switching are neglected in the timing diagram of FIG. 5. Those skilled in the art will understand that in actual implementation, the timing diagram of FIG. 3 and FIG. 4 will incorporate such delays.

In FIG. 5, waveforms for the first clock signal source 102, the second clock signal source 104, the select input 110, the first clock signal 106, the second clock signal 108, the dynamic node 115, and the output 132. As is shown in FIG. 5, when the select input 110 is 'low,' the first clock signal 106 equals the first clock signal source 102 (not including delay) and the second clock signal 108 is 'high.' In this case, the dynamic circuit 105 (FIG. 4) operates at the frequency of the first clock signal 106.

As mentioned above with reference to FIG. 4, when the first clock signal 106 goes 'low,' the dynamic circuit 105 enters a precharge phase, in which the dynamic node 115 goes or remains 'high.' When the first clock signal 106 goes 'high,' the dynamic node 115 is dependent on the function of the evaluation block 116. For example, in evaluation phase a (indicated in FIG. 5), the evaluation block 116 is 'active,' i.e., the evaluation block 116 evaluates to a value that facilitates a connection between ground 121 and the dynamic node 115. Accordingly, in evaluation phase a, the dynamic node 115 goes 'low.' Moreover, as evident in FIG. 5, the evaluation block 116 is 'active' and the dynamic node 115 is 'low' in evaluation phases c and d.

In evaluation phase b, the evaluation block 116 is 'inactive,' i.e., the evaluation block 116 evaluates to a value that does not facilitate a connection between ground 121 and the dynamic node 115. Accordingly, in evaluation phase b, the dynamic node 115 remains 'high.'

When the select input 110 is 'high,' the second clock signal 108 equals the second clock signal source 104 (not including delay) and the first clock signal 106 is 'high.' In this case, the dynamic circuit 105 operates at the frequency of the second clock signal 108.

As mentioned below with reference to FIG. 4, when the second clock signal 108 goes 'low,' the dynamic circuit 105 enters a precharge phase, in which the dynamic node 115 goes or remains 'high.' When the second clock signal 108 goes 'high,' the dynamic node 115 is dependent on the function of the evaluation block 116. For example, in evaluation phase e (indicated in FIG. 5), the evaluation block 116 is 'active.' Accordingly, in evaluation phase e, the dynamic node 115 goes 'low.' In evaluation phase f the evaluation block 116 is 'inactive,' and accordingly, in evaluation phase f the dynamic node 115 remains 'high.'

As shown in FIG. 5, the output 132 is responsive to the dynamic node 115. When the dynamic node is 'high,' the output 132 goes 'low,' and when the dynamic node is 'low,' the output 132 gets driven to either Vdd_nom 117 (FIG. 4) or Vdd_low 119 (FIG. 4) depending on the select input 110 (FIG. 3).

Advantages of the present include may include one or more of the following. In one or more embodiments, because a dynamic circuit may operate in a normal power consumption mode and at least one reduced power consumption mode, overall power dissipation is reduced relative to a dynamic circuit that cannot operate in the at least one reduced power consumption mode.

In one or more embodiments, because a dynamic circuit may operate in a normal power consumption mode and at least one reduced power consumption mode, a system using the dynamic circuit is provided with a mode of power optimization in which hardware or software may exploit additional flexibility resulting from reduced power consumption.

Dynamic circuits in accordance with one or more embodiments of the present invention may advantageously allow for a low-power slow computation mode when high data throughput is not necessary and/or when high data throughput cannot be maintained due to electrical and/or thermal concerns.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a normal supply voltage and a reduced supply voltage, comprising:
   a clock signal selector adapted to output a first clock signal and a second clock signal dependent on a select input to the clock signal selector; and
   a dynamic circuit comprising:
      a dynamic node that, in a precharge phase, is connected to one of the normal supply voltage and the reduced supply voltage dependent on the first clock signal and the second clock signal, and
      an output stage, responsive to the dynamic node, having a first driver device and a second driver device, wherein, in an evaluation phase, one of the first driver device is selectively used to drive the normal supply voltage onto an output of the dynamic circuit and the second driver device is selectively used to drive the reduced supply voltage onto the output.

2. The integrated circuit of claim 1, wherein a frequency of the output is dependent on the first clock signal and the second clock signal.

3. The integrated circuit of claim 1, wherein the first clock signal has a first frequency and the second clock signal has a second frequency, and wherein the first frequency is greater than the second frequency.

4. The integrated circuit of claim 1, wherein the output, in the precharge phase, is at a logic low value.

5. The integrated circuit of claim 1, the dynamic circuit further comprising:
an evaluation block that selectively drives the dynamic node in the evaluation phase dependent on at least one input to the evaluation block.

6. The integrated circuit of claim 1, the dynamic circuit further comprising:
a first precharge device operatively connected to the dynamic node, wherein the first clock signal serves as an input to the first precharge device, and wherein the first precharge device is operatively connected to the normal supply voltage; and
a second precharge device operatively connected to the dynamic node, wherein the second clock signal serves as an input to the second precharge device, and wherein the second precharge device is operatively connected to the reduced supply voltage.

7. The integrated circuit of claim 1, the integrated circuit having a third supply voltage.

8. The integrated circuit of claim 1, wherein the clock signal selector is adapted to output a third clock signal dependent on the select input.

9. An integrated circuit having a normal supply voltage and a reduced supply voltage, comprising:
a clock signal selector adapted to output a first clock signal and a second clock signal dependent on a select input to the clock signal selector; and
a dynamic circuit comprising:
an input stage having an evaluation block and a dynamic node,
wherein, in a precharge phase, the dynamic node is operatively connected to one of the normal supply voltage and the reduced supply voltage dependent on the first clock signal and the second clock signal, and wherein, in an evaluation phase, the dynamic node is selectively connected to ground dependent on at least one input to the evaluation block, and
an output driver stage responsive to the dynamic node, wherein the output driver stage selectively drives one of the normal supply voltage and the reduced supply voltage onto an output of the dynamic circuit dependent on the select input.

10. The integrated circuit of claim 9, wherein the first clock signal has a first frequency and the second clock signal has a second frequency, and wherein the first frequency is greater than the second frequency.

11. The integrated circuit of claim 9, wherein a frequency of the output is dependent on the first clock signal and the second clock signal.

12. The integrated circuit of claim 9, the input stage comprising:
a first precharge device operatively connected to the dynamic node, wherein the first clock signal serves as an input to the first precharge device, and wherein the first precharge device is operatively connected to the normal supply voltage; and
a second precharge device operatively connected to the dynamic node, wherein the second clock signal serves as an input to the second precharge device, and wherein the second precharge device is operatively connected to the reduced supply voltage.

13. The integrated circuit of claim 9, the output driver stage comprising:
a first driver device that drives the normal supply voltage onto the output dependent on the dynamic node and the select input; and
a second driver device that drives the reduced supply voltage onto the output dependent on the dynamic node and a complement of the select input.

14. An integrated circuit having a normal supply voltage and a reduced supply voltage, comprising:
clock selecting means for providing a first clock signal having a first frequency and second clock signal having a second frequency, wherein the first frequency is greater than the second frequency;
precharge means for driving a dynamic node, in a precharge phase, to one of the normal supply voltage and the reduced supply voltage dependent on the first clock signal and the second clock signal;
evaluation means for evaluating at least one data input, wherein the dynamic node is, in an evaluation phase, dependent on the evaluation means; and
output means for selectively driving one of the normal supply voltage and the reduced supply voltage onto an output dependent on the dynamic node and a select input to the clock selecting means.

15. A method for performing dynamic circuit operations using a normal supply voltage and a reduced supply voltage, comprising:
selectively outputting a first clock signal having a first frequency and a second clock signal having a second frequency, wherein the first frequency is greater than the second frequency;
in a precharge phase, precharging a dynamic node to one of the normal supply voltage and the reduced supply voltage dependent on the first clock signal and the second clock signal;
in an evaluation phase, allowing the dynamic node to be driven by an evaluation block dependent on at least one input to the evaluation block; and
selectively driving onto an output one of the normal supply voltage and the reduced supply voltage dependent on the dynamic node and a select signal used for the selectively outputting.

16. The method of claim 15, wherein a frequency of the output is dependent on the first clock signal and the second clock signal.

17. The method of claim 15, further comprising selectively outputting a third clock signal having a third frequency.

* * * * *